United States Patent [19]

Urushima

[11] Patent Number: 5,743,459
[45] Date of Patent: Apr. 28, 1998

[54] METHOD FOR FABRICATING SEMICONDUCTOR DEVICE WITH STEP OF BONDING LEAD FRAME LEADS TO CHIP PADS

[75] Inventor: Michitaka Urushima, Tokyo, Japan

[73] Assignee: NEC Corporation, Japan

[21] Appl. No.: 543,625

[22] Filed: Oct. 16, 1995

[30] Foreign Application Priority Data

Oct. 14, 1994 [JP] Japan .................................. 6-276062

[51] Int. Cl.⁶ ................................................... H01L 21/60
[52] U.S. Cl. ......................................................... 228/180.21
[58] Field of Search ............................ 228/110.1, 123.1, 228/179.1, 180.21; 438/611

[56] References Cited

U.S. PATENT DOCUMENTS 5,288,006   2/1994   Otsuka et al. .................. 228/179.1

FOREIGN PATENT DOCUMENTS 2-174136   7/1990   Japan .

Primary Examiner—Samuel M. Heinrich
Attorney, Agent, or Firm—Ostrolenk, Faber, Gerb & Soffen, LLP

[57] ABSTRACT

The method for fabricating a semiconductor device disclosed is to bond an inner lead and a pad of a semiconductor chip together using a bonding tool. The bonding tool has a bottom peripheral end being formed in either a circular arc shape with a curvature or a sloped surface shape with a chamfer angle. The inner lead is placed over the pad of the semiconductor chip, and the bonding tool is placed at a location inside an edge of a passivation film formed at a peripheral portion of the pad. The inner lead and the pad of the semiconductor chip are pressed together by using the bonding tool. This enables the reliable bonding of the inner lead and the semiconductor chip pad without requiring to use a bump structure.

3 Claims, 6 Drawing Sheets

METHOD FOR FABRICATING SEMICONDUCTOR DEVICE WITH STEP OF BONDING LEAD FRAME LEADS TO CHIP PADS

BACKGROUND OF THE INVENTION (1) Field of the Invention

The present invention relates to a method for fabricating a semiconductor device, and more particularly to a method for fabricating a semiconductor device involving a step of bonding a TAB (Tape Automated Bonding) tape or an inner lead of a lead frame to a pad of a semiconductor chip.

(2) Description of the Related Art

First, a conventional Inner Lead Bonding (ILB) method of a TAB type of the kind to which the present invention relates is explained to assist the understanding of the present invention. As shown in FIGS. 1A and 1B, in carrying out the ILB, a pad 5 of a semiconductor chip 6 and an inner lead 2 with metal plating 3 applied are placed with a bump 12 disposed therebetween, and they are thermally compressed from above the inner lead 2 by using a bonding tool 1. In the drawings, the numeral 7 represents a bonding agent and the numeral 8 represents a base film.

In the above example, the bump 12 is required because the pad 5 of the semiconductor chip 6 is positioned below the level of a passivation film 4. One kind of such a bump is that of a metal bump or ball bump formed at the side of the pad of the semiconductor chip and another kind is that of a transferred bump formed at the side of the lead.

In the absence of the bump 12, the inner lead 2 touches the passivation film 4 so that the contact becomes unstable and a crack occurs in the passivation film 4, leading to the unreliability of the resulting structure. Thus, in order to facilitate the contact, it has been considered necessary to select the kinds of metals such as gold, tin and solder for the formation of the metal plating 3 and the bump 12.

In the conventional methods which include a lead bump type bonding method and in which, as shown in FIG. 1B, the semiconductor chip 6 and the inner lead 2 provided with the metal plating 3 are bonded together using a bonding tool 1 with the thermal compression applied from above the inner lead 2, the inner lead 2 is provided with a recessed portion 13 at an intermediate portion thereof and a projected portion at the tip end thereof so that the inner lead 2 does not touch the passivation film 4 and that the stable connection can be attained.

As explained above, the prior art arrangement illustrated in FIG. 1A requires the bump in the ILB and, thus involves an enormous fabrication cost. Especially, such a metal plating bump type method is disadvantageous as it involves complex process steps. A technology relating to such a method is disclosed, for example, in Japanese Patent Application Kokai Publication No. Hei 2-174136. According to the disclosed method, a finger lead is provided at its contacting surface with convex portions formed by plating using precipitated particles of copper. When the compress bonding is carried out, the convex portions destroy an oxidized substance on the surface of the aluminum (Al) pad. In this case, where the metal plating for bonding with Al, which is a usual metal used in bonding, is gold, the bonding is possible as is metallurgically known. However, this has not been possible in the case where the metal plating is, for example, tin and solder.

Also, in the arrangement which is shown in FIG. 1B and which is disclosed in Japanese Patent Application Kokai Publication No. Hei 2-174136 illustrated in FIG. 1B wherein the lead is provided with the recessed portion at an intermediate portion thereof and with the projected portion at the tip end thereof, there is a problem that the region where the projected portion is formed (for example, by etching) becomes thin whereby the residual stresses allow the lead to be bent upwards or downwards.

For the above reason, the copper foil constituting the lead that can be used is limited only to a thick one. That is, generally, for a narrow pitch ILB, the copper foil for carrying out the etching of the lead is required to be about 35 µm thick in the case of a pitch of above 100 µm, be about 25 µm thick in the case of a pitch between 100 µm and 80 µm, and to be about 15 µm thick in the case of a pitch below 80 µm. Thus, it can be seen that, from a practical point of view, it is not feasible to realize narrow pitches in the ILB method.

SUMMARY OF THE INVENTION

The fabrication method in the case where the metal plating of the inner lead is gold includes at least a step of placing the inner lead over the pad of the semiconductor chip and a step of bonding the inner lead and the pad together. The bonding step is carried out by placing the bonding tool inside the periphery of the passivation film at the side of the semiconductor chip edge formed at the peripheral portion of the pad and by pressing the inner lead and the pad together.

In this case, the method may include a step of providing the passivation film with a tapered (or sloped) end so that the tip end portion of the inner lead is not pressed onto the passivation film and so that, upon completion of the bonding, the tip end portion of the inner lead is within the end portion of the pad.

In the case where the metal plating is tin, solder, etc., the method may include a process of bonding the inner lead to the pad, in which the inner lead which has its surface covered with a metal film and which is formed by a metal having a resistance lower than that of the metal film is pressed against a sheet having a concave/convex surface thereby causing the concave/convex surface to be transferred onto the contacting surface of the inner lead. This results in the exposure of the metal of the metal film covering the surface of the inner lead at the convex side portion of the concave/convex surface of the contacting surface of the lead film.

Also, the method may include a step wherein, in order to prevent the occurrence of short-circuiting at the edge portions, the inner lead and the projected portion of the base field are provided at different levels.

Further, the method may include a step wherein, in order to prevent the occurrence of breakage of the end of the passivation film, the tip end portion of the lead film is slightly bent upwards so that this tip end portion of the lead film does not touch the passivation film.

According to the method of the present invention in which the inner lead and the pad of the semiconductor chip are press-bonded together by using a bonding tool, the bonding therebetween is accomplished reliably without using a bump structure. Especially, in the gang bonding, the bonding of the lead and the pad can be carried out reliably without using the bump structure.

Also, by preprocessing the inner lead, it enables the possibility of preventing the breakage from occurring in the passivation film caused by the tip end portion of the lead film during the bonding process.

Furthermore, by providing a tapered form at the end of the passivation film on the pad of the semiconductor chip, it enable the possibility of ensuring the prevention of the breakage in the passivation film.

Also, according to the invention, by forming a concave/convex surface on the contacting surface of the inner lead that is in contact with the pad of the semiconductor chip, the metal is caused to be exposed from the metal film covering the surface of the inner lead thereby enabling the achievement of excellent bonding. Thus, even when the lead is not, for example, gold plated, but plated with other inexpensive metals, it is possible to carry out the bonding between the lead and the semiconductor chip without requiring a bump structure. For forming the concave/convex surface on the inner lead, the inner lead is pressed against a transfer sheet having a concave/convex surface so as to transfer this concave/convex surface onto the contacting surface of the inner lead. This concave/convex surface is used to expose the metal from the side of the convex portion of the concave/convex portion of the contacting surface of the inner lead.

BRIEF DESCRIPTION OF THE DRAWINGS

The above and other objects, features and advantages of the present invention will be apparent from the following description of preferred embodiments of the invention explained with reference to the accompanying drawings, in which:

FIG. 2C shows, in an enlarged sectional view, a portion of the structure shown in FIG. 2A for explaining a second embodiment;

PREFERRED EMBODIMENTS OF THE INVENTION

Now, preferred embodiments of the invention are described with reference to the drawings.

Embodiment 1

A first embodiment is explained with reference to FIGS. 2A and 2B.

Figure 1A:
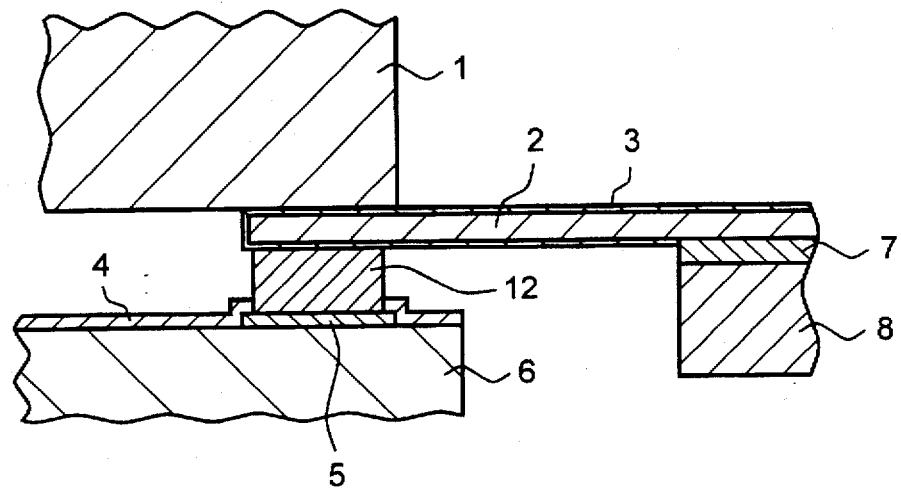
FIGS. 1A and 1B are sectional views of a prior art structure being processed, FIG. 1A showing a first prior art example and FIG. 1B showing a second prior art example.
Figure 1B:
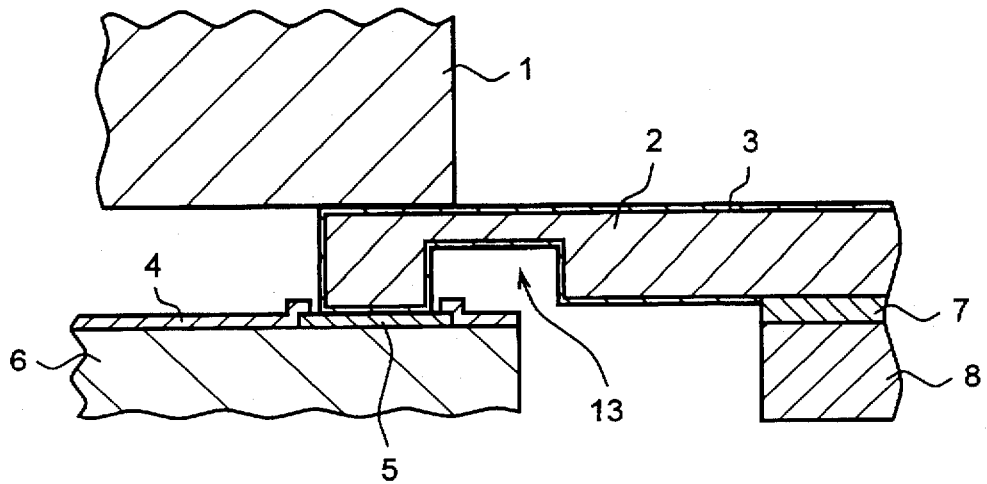
Figure 2A:
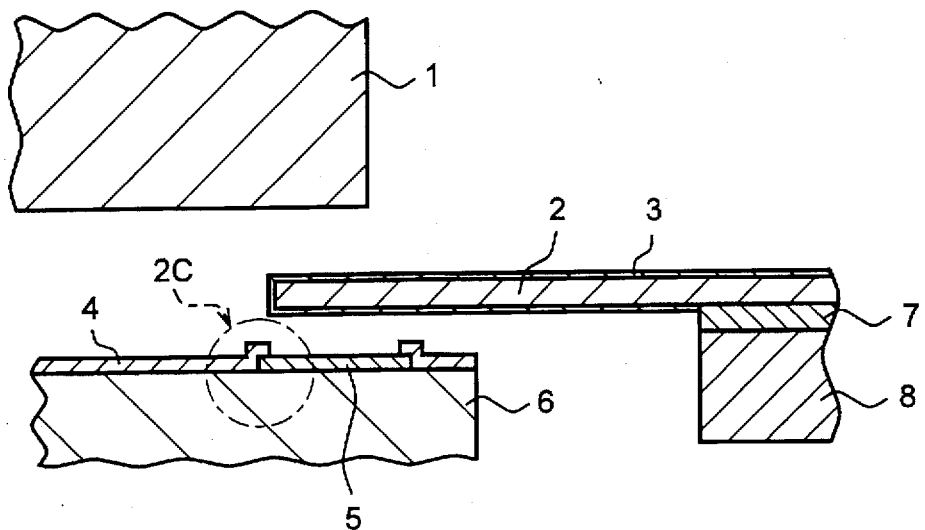
FIGS. 2A, 2B and 2C are diagrammatic sectional views of a structure for explaining processing steps of a method of a first embodiment according to the invention, FIGS. 2A and 2B showing a state before and a state during a compression process, respectively.
Figure 2B:
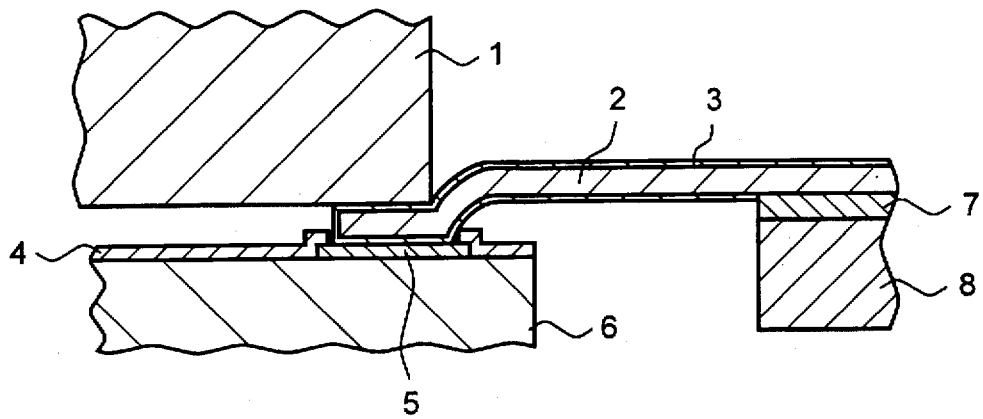

FIGS. 2A and 2B show in sectional views a structure for use in explaining processing steps of a method of a first embodiment according to the invention, FIGS. 2A and 2B showing a state before and a state during a compression process, respectively.

As shown in FIG. 2A, the semiconductor chip 6 is provided with a pad 5 and a passivation film 4. The inner lead 2 is provided with metal plating 3 and is bonded to a base film 8 by a bonding agent 7. An ILB tool 1 (bonding tool) applies the pressure from above the inner lead 2.

The inner lead 2 is placed above the pad 5 of the semiconductor chip 6 which is heated to about 80°–150° C. Then, the ILB tool 1 (explained later with reference to FIGS. 3A–3C) which is heated to about 450°–500° C. is placed in position above the semiconductor chip 6 such that it is on the inner side of the edge side portion of the semiconductor chip 6 of the passivation film 4.

Next, as shown in FIG. 2B, the ILB tool 1 presses the inner lead 5 from above towards the pad 5 so that they can be in complete contact and be bonded together.

The ILB tool which is used in the fabrication of the structure shown in FIGS. 2A and 2B is explained with reference to FIGS. 3A, 3B and 3C.

That is, the main feature of the first embodiment is to improve the shapes of the ILB tool. Conventionally, when the bonding is carried out with no bump structure, it has not been possible to bond the lead and the pad of the chip together completely unless the inner lead is pressed to the extent that it is nearly broken. This results in weakening of the strength of a neck portion of the inner lead and deterioration of the reliability. Thus, by appropriately shaping the peripheral end of the particular portion of the under surface of the ILB tool that presses the lead so as to make the plastic deformation thereof uniform, it enables the suppression of the thickness of the lead after the bonding process to ⅔ of that before the bonding process thereby enhancing the reliability.

Figure 3A:
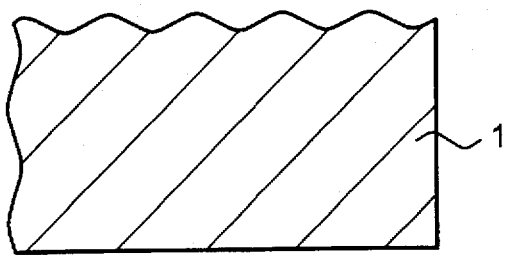
FIGS. 3A, 3B and 3C are diagrammatic sectional views of the bonding tool which has a bottom peripheral end being formed in different shapes, for use in the explanation of the first embodiment.
Figure 3B:
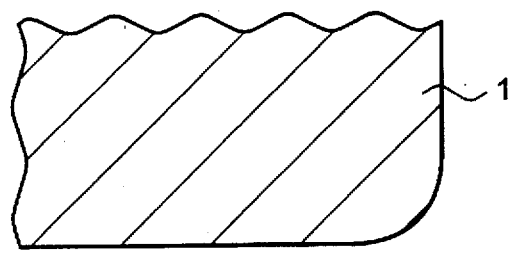
Figure 3C:
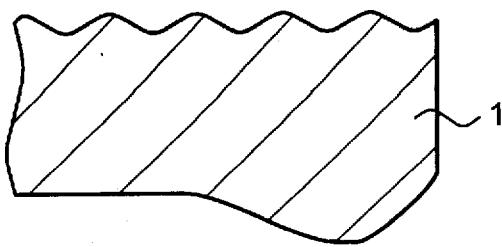

In carrying out the fabrication process, the bonding tool having a shape as shown in FIGS. 3B and 3C can be used effectively since, when the ILB tool 1 is pressed from above and the inner lead 2 and the pad 5 are brought into complete contact and bonded together, the ILB tool operates such that the portion of the inner lead 2 that is touched by the peripheral portion of the ILB tool is prevented from becoming weak.

The results of the experiment conducted are as explained below.

When the ILB tool having the shape as shown in FIG. 3A was used and, by applying pressure from above, the inner lead 2 and the pad 5 were brought in complete contact and bonded together, that is, when they were pressed and bonded in their best condition, the thickness of the inner lead upon completion of the process was about ½ of the initial thickness thereof.

When the ILB tool used had the shape as shown in FIG. 3B with a radius of curvature R at the contacting surface being about 40 μm–80 μm or a chamfer angle 4 being 45°–60°, or had the shape as shown in FIG. 3C with a radius of curvature R at the contacting surface being about 20 μm–100 μm, the plastic deformation progressed uniformly so that it was possible to suppress the thickness of the inner lead to ⅔ of the initial thickness thereof.

Thus, it was confirmed that the method could be applied to narrow pitch bonding of the inner leads. The term "chamfer angle" refers to an angle with which the under surface end portion of the tool is curved upwards from the under surface of the tool.

Embodiment 2

Figure 2C:
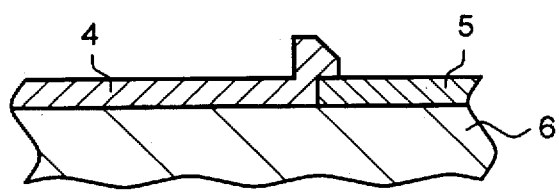

A second embodiment is explained with reference to FIG. 2C which shows, in an enlarged sectional view, a portion 2C of the structure shown in FIG. 2A.

Here, in order to prevent the inner lead 2 from interfering with the passivation film 4 of the semiconductor chip 6 during the bonding process, the passivation film 4 is provided with a tapered portion.

The taper is appropriately determined depending on the thickness of the passivation film 4, the thickness of the inner lead 2 and the length of the tip end portion of the inner lead 2.

The shape of the taper is determined depending on the selected kind of material for and thickness of the passivation film. In the experiment, a polyimide film with a thickness of about 5 μm and a taper angle of about 45° is used.

It was found possible to form the desired taper angle if, prior to the formation of the polyimide film, a multi-layer mask with each layer having its masked size progressively increasing in the upward direction from the pad 5, or, in the case of a wet etching method, a single mask having a desired shape was used.

The invention includes the method for forming the above structure of the passivation film as one of the features of the invention.

Embodiment 3

A third embodiment of the invention is now explained with reference to FIGS. 4A and 4B, and FIG. 5.

In the case where the ILB tool is used to press and bond the inner lead and the pad together, it was possible to carry out the bonding stably when gold was used as metal plating, but it was found difficult to do so when tin, solder, etc. were used. This embodiment relates to examples wherein such bonding can be carried out without difficulties.

Figure 4A:
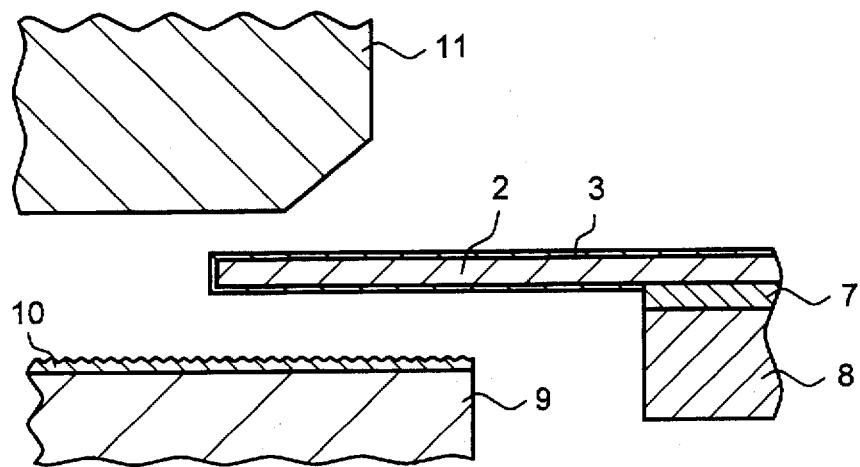
FIGS. 4A and 4B are diagrammatic sectional views of a structure for use in explaining processing steps of a method of a third embodiment according to the invention, the diagrams being for use in explaining a process which provides an exposed new surface in the inner lead.
Figure 4B:
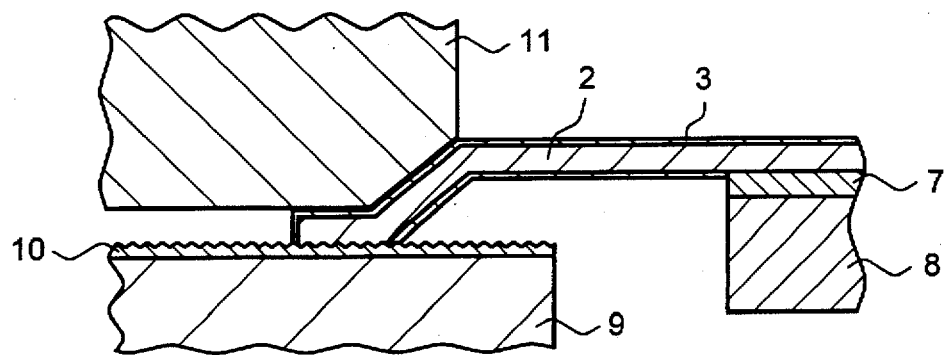

FIGS. 4A and 4B are diagrams for use in explaining a process which provides an exposed new surface in the inner lead 2.

As shown in FIG. 4A, prior to the ILB process, the inner lead 2 is placed on a shaping stage 9 on which a concave/convex forming sheet 10 is disposed.

Next, as shown in FIG. 4B, a concave/convex forming tool 11 which is for deforming the inner lead 2 and which has a tapered corner presses the inner lead thereby producing the exposed new surface in the inner lead 2.

Figure 6A:
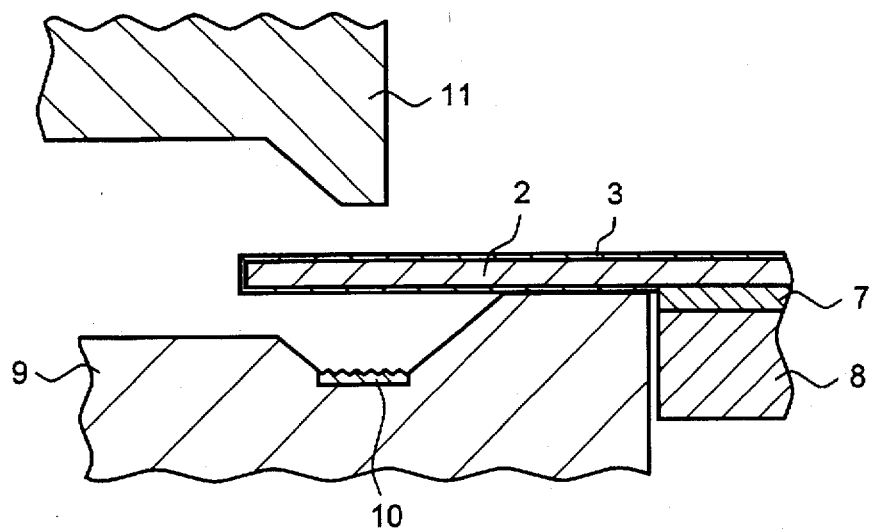
FIGS. 6A, 6B and 6C are diagrammatic sectional views of a structure for explaining processing steps of a method of a fourth embodiment according to the invention, FIGS. 6A and 6B showing a state before and a state during a compression process, respectively, and FIG. 6C showing, in an enlarged sectional view, a portion of the structure shown in FIG. 6B.
Figure 6B:
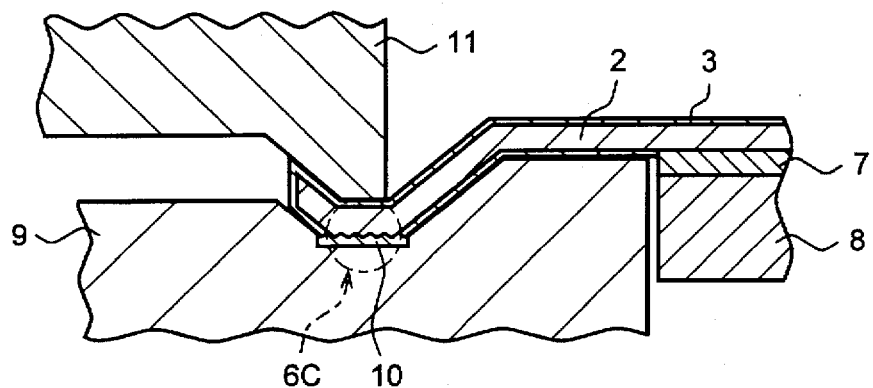
Figure 6C:
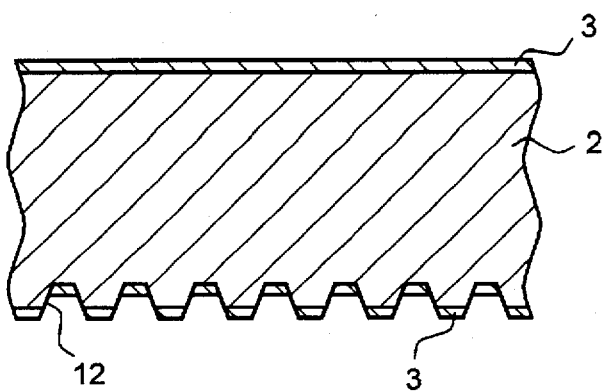

The process of producing the exposed new surface in the inner lead 2 is explained further with reference to an enlarged view in FIG. 6C. The object of this process is to remove as much metal plating 3 as possible from the contacting surface so as to produce the new exposed surface in the inner lead 2, the surface condition of the concave/convex forming sheet 10 is varied depending on the thicknesses of the metal plating 3. It is satisfactory if the surface condition of the sheet 10 is rougher than that of the metal foil which is the material of the inner lead. For example, where the surface roughness $R_{max}$ of the metal foil is on the order of 0.6 μm, each concave/convex form is required to be about 1 μm. Further, if a copper foil whose mechanical resistance is lower than that of tin or solder plating is used for a metal foil, it is possible to produces the concave/convex form more easily.

Figure 5:
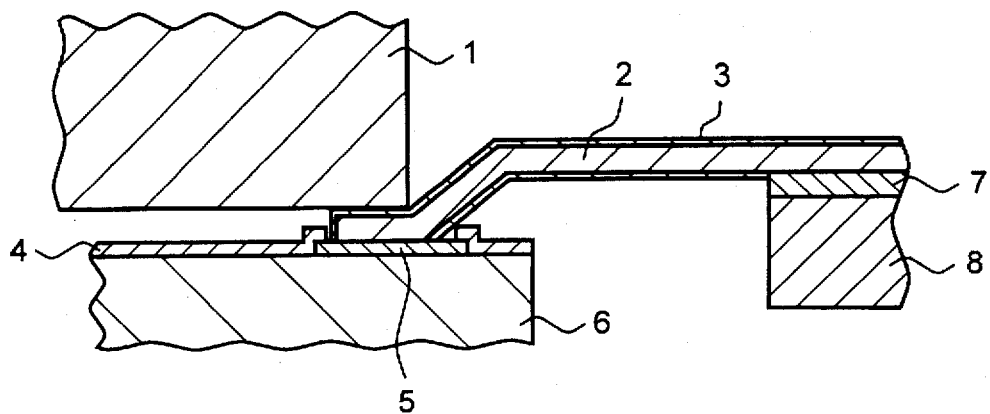
FIG. 5 is a diagram showing a state in which the inner lead and the pad are being pressed together by the bonding tool in the method of the third embodiment according to the invention.

Next, as shown in FIG. 5, the inner lead which has been processed and provided with the exposed new surface in the inner lead 2 is pressed by the bonding tool 1 thereby bringing the inner lead 2 and the pad 5 into a state of complete contact and bonding them together.

In the above example, in order to prevent the oxidation of the exposed new surface, the inner lead processing and the ILB processing may both or respectively be carried out in a system having, for example, a nitrogen atmosphere. In this case, it is possible to carry out the satisfactory bonding even when the inner lead is without metal plating and is of a material such as a copper foil (which is usual) since the processed new surface remains exposed.

Embodiment 4

Now, a fourth embodiment of the invention is explained with reference to FIGS. 6A–6C, and FIG. 7.

FIGS. 6A–6C show sequential process steps with which the new surface of the inner lead 2 is caused to be exposed.

As shown in FIG. 6A, the inner lead 2 is placed on the forming stage 9 on which the concave/convex forming sheet 10 is disposed. In this forming stage 9, the portion where the concave/convex forming sheet 10 is disposed is positioned at a lower level.

Next, as shown in FIG. 6B, the concave/convex forming tool 11 presses the inner lead 2. The concave/convex forming tool 11 has a portion whose shape corresponds to that of the forming stage 9. In this way, at the same time as the new surface of the inner lead 2 is caused to be exposed, the tip end portion of the inner lead 2 is caused to be bent upwards.

FIG. 6B shows the state in which the tip end portion of the inner lead is bent upwards and FIG. 6C shows, in an enlarged view, a portion 6C which is taken from FIG. 6B and in which the new surface 12 is produced in the inner lead 2.

Figure 7:
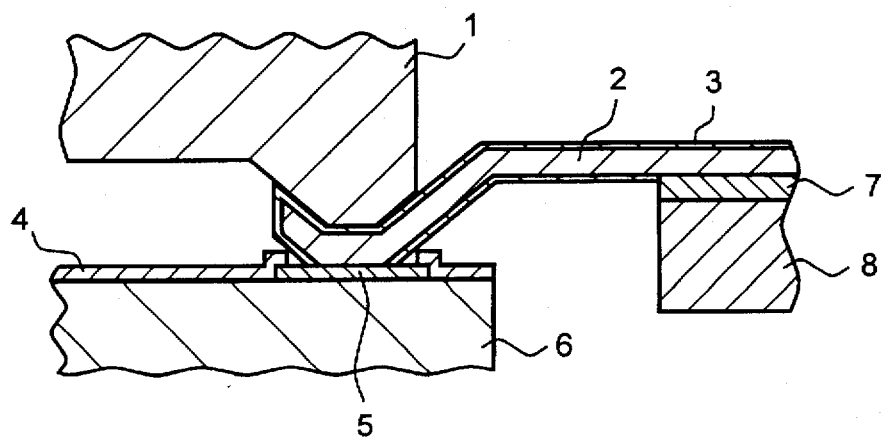
FIG. 7 is a diagram showing a state in which the inner lead and the pad are being pressed together by the bonding tool in the method of the fourth embodiment according to the invention.

Next, as shown in FIG. 7, the inner lead which has been processed and provided with the exposed new surface in the inner lead 2 is pressed by the bonding tool 1 thereby bringing the inner lead 2 and the pad 5 into a state of complete contact and bonding them together. Since the tip end portion of the inner lead 2 is to be shaped in an upward form, the bonding tool 1 used has a shape corresponding to the shape in the upward form.

Thus, in this embodiment, in order to prevent the tip end portion of the inner lead 2 from touching and damaging the passivation film, the deforming process is carried out by using the concave/convex forming tool 11 having the upwardly deformed tip end portion and the forming stage 9. Thereafter, the ILB process completes the bonding process as shown in FIG. 7.

As explained above, the invention enables the reliable bonding of the lead and the semiconductor chip pad without the need for using a bump structure. Especially when this is applied to the gang bonding, the leads and the pads are reliably bonded without involving bump structures.

Further, since the inner lead is pre-deformed, it is possible to prevent the tip end portion of the lead from damaging the passivation film during the bonding process. Also, since the portion of the passivation film that is positioned above the semiconductor chip pad is tapered, it is possible to ensure the prevention of damage to the passivation film during the bonding process whereby the reliability of the resulting product is enhanced.

Moreover, by the concave/convex surface provided to the surface of the inner lead in contact with the semiconductor chip pad, the metal of the metal film covering the surface of the inner lead is caused to be exposed thereby enabling the bonding to be in an excellent state. Even when the lead is not gold plated and thus is plated with an inexpensive metal, it is possible to achieve satisfactory bonding of the lead and the semiconductor chip pad without the bump structure that would otherwise be necessary.

Also, since no residual stresses can cause the lead to be bent upwards or downwards, it is possible to realize a narrow pitch bonding process in the ILB.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for bonding an inner lead to a pad of a semiconductor device using a bonding tool having a contacting surface: wherein said inner lead includes a first portion for bonding to said pad, a second portion, and a metal plating; and said semiconductor device includes a base film for operatively engaging said second portion, said base film being spaced laterally away and upwardly disposed from said pad, said method comprising the steps of:

forming said inner lead such that said first portion is at a level lower than said second portion;

roughening a surface of said inner lead which contacts said pad such that at least some of said metal plating is punctured;

placing said inner lead over said pad, said pad including a passivation film having edges formed over a peripheral portion of said pad;

placing said bonding tool such that said contacting surface is located inside at least one said edge of said passivation film, said contacting surface of said bonding tool being of a sufficient width to make the plastic deformation of said inner lead uniform; and pressing said inner lead against said pad with said bonding tool such that said inner lead is substantially evenly bonded to said pad.

2. The method of claim 1 wherein said first portion of said inner lead includes a tip portion and said step of forming said inner lead further includes bending said tip portion upwardly such that said inner lead does not interfere with the passivation film during said bonding step.

3. A method for bonding an inner lead having metal plating to a pad of a semiconductor device using a bonding tool having a contacting surface, said method comprising the steps of:

heating said pad to a temperature of about 80° to 150° C.;

placing said inner lead over said pad, said pad including a passivation film having edges formed over a peripheral portion of said pad;

heating said bonding tool to about 450° to 500° C.;

placing said bonding tool such that said contacting surface is located inside at least one said edge of said passivation film, said contacting surface of said bonding tool being of a sufficient width to make the plastic deformation of said inner lead uniform; and pressing said inner lead against said pad with said bonding tool such that said inner lead is substantially evenly bonded to said pad.

* * * * *